(12) United States Patent
Byun et al.

(10) Patent No.: US 7,274,259 B2
(45) Date of Patent: Sep. 25, 2007

(54) LAYOUT STRUCTURE OF SIGNAL DRIVER

(75) Inventors: Gyung-Su Byun, Seoul (KR); Jung-Hwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 216 days.

(21) Appl. No.: 11/129,272

(22) Filed: May 14, 2005

(65) Prior Publication Data
US 2006/0119432 A1 Jun. 8, 2006

(30) Foreign Application Priority Data
Dec. 6, 2004 (KR) .................. 10-2004-0101615

(51) Int. Cl.
*H03F 3/45* (2006.01)
(52) U.S. Cl. ...................... 330/307; 330/261
(58) Field of Classification Search ............... 327/565, 327/566; 330/261, 307
See application file for complete search history.

(56) References Cited

U.S. PATENT DOCUMENTS 4,767,945 A * 8/1988 Quinn .................. 327/412

5,097,157 A * 3/1992 Jaffe et al. .................. 327/55
2002/0176198 A1 11/2002 Cyrusian et al. ............ 360/68

FOREIGN PATENT DOCUMENTS

JP 01257579 9/2001

* cited by examiner

*Primary Examiner*—Steven J. Mottola
(74) *Attorney, Agent, or Firm*—F. Chau & Assoc., LLC

(57) ABSTRACT

Disclosed herein is a layout structure of a signal driver. The layout structure of the signal driver of the present invention includes a first signal response unit, a second signal response unit, and a current source unit. The first signal response unit responds to a first input signal, and the second signal response unit responds to a second input signal. The current source unit has a plurality of bias unit pairs for restricting currents provided to the first and second signal response units to respective source currents thereof. The bias unit pairs each include at least two bias units, which are separately arranged on opposite sides of a predetermined imaginary centerline. According to the layout structure of the signal driver of the present invention, there is a benefit in that current mismatch occurring between the first and second current response units is reduced, thus consequently improving the operating characteristics of the signal driver.

7 Claims, 7 Drawing Sheets

LAYOUT STRUCTURE OF SIGNAL DRIVER

BACKGROUND OF THE INVENTION

This application claims the priority of Korean Patent Application No. 10-2004-0101615, filed on Dec. 6, 2004, in the Korean Intellectual Property Office, the disclosure of which is incorporated herein in its entirety by reference.

1. Field of the Invention

The present invention relates, in general, to a layout structure of a semiconductor device and, more particularly, to a layout structure of a signal driver.

2. Description of the Related Art

Generally, a signal driver, such as an output driver, generates two output signals, which swing in opposite phases. In this case, the two output signals are required to have a wide output signal interval (that is, an interval in which a voltage difference is maintained above a certain level) so as to ensure the range that allows a signal value to be recognized.

FIG. 1 is a circuit diagram of a conventional signal driver 100, and FIG. 2 is a view showing the layout structure of the signal driver 100 of FIG. 1. The signal driver 100 of FIGS. 1 and 2 includes a first signal response unit 110, a second signal response unit 120 and a current source unit 130. Further, the current source unit 130 includes first to fourth bias units 131 to 134. MOS transistors implementing the four bias units 131 to 134, respectively, are constructed to have different W/L values (W: transistor channel width, L: transistor channel length). Therefore, source currents flowing through the first and second signal response units 110 and 120 can be variously restricted by respective bias control signals BIAS1 to BIAS4. The intrinsic resistance that forms between any two neighboring bias units, 131 to 134, is symbolized by reference items RS1, RS2 and RS3 in FIG. 2.

The bias units 131 to 134 of the conventional signal driver 100 are horizontally asymmetrically arranged, as shown in FIG. 2. Therefore, the skew in distance between the first and second signal response units 110 and 120 and the bias units 131 to 134 are generated, so that differences in actual resistance values exist.

In the layout structure of the conventional signal driver 100, current mismatch occurs between the first and second signal response units 110 and 120 with respect to the bias units 131 to 134, that is, the current source unit 130. The layout structure of the conventional signal driver 100 is of concern in that operating characteristics, such as output signal intervals, are deteriorated.

SUMMARY OF THE INVENTION

Accordingly, the present invention provides a layout structure of a signal driver that reduces current mismatch occurring between first and second signal response units with respect to a current source unit, thus improving the operating characteristics of the signal driver.

In accordance with an aspect of the present invention, there is provided a layout structure of a signal driver driven to correspond to a voltage difference between first and second input signals. The signal driver includes a first signal response unit, a second signal response unit, and a current source unit. The first signal response unit responds to the first input signal received through a first input gate terminal. The second signal response unit responds to the second input signal received through a second input gate terminal. The current source unit has a plurality of bias unit pairs for restricting currents provided to the first and second signal response units to respective source currents thereof. The bias unit pairs each comprise at least two bias units controlled by each bias control signal corresponding thereto. The two bias units are separately arranged on opposite sides of a predetermined imaginary centerline so as to reduce current mismatch occurring between the first and second signal response units. The imaginary centerline is an imaginary line that is a set of points spaced apart by the same distances from opposite reference points of the corresponding first and second signal response units.

Preferably, the imaginary centerline may be an imaginary line that is a set of points spaced apart by the same distances from the first and second input gate terminals.

Preferably, the current source unit may further include first and second current matching units arranged on opposite sides of the imaginary centerline to compensate for current mismatch occurring between the first and second signal response units. The first and second current matching units may be driven in response to first and second compensation control signals, respectively.

DESCRIPTION OF THE PREFERRED EMBODIMENTS

Figure 1:
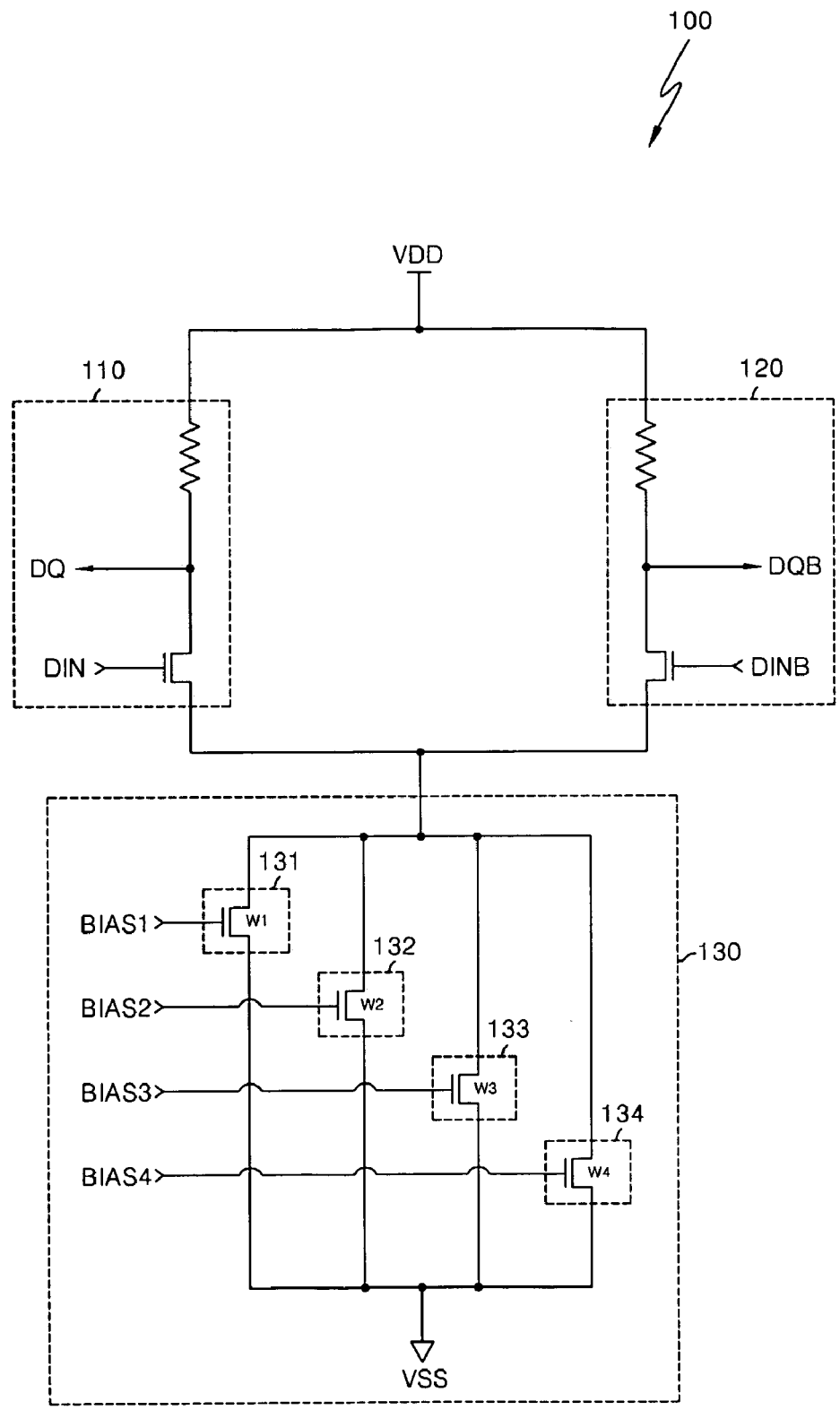
FIG. 1 is a circuit diagram of a conventional signal driver.

The above features of the present invention will be more clearly understood from the following detailed description taken in conjunction with the accompanying drawings. Reference now should be made to the drawings, in which the same reference numerals are used throughout the different drawings to designate the same or similar components.

Hereinafter, embodiments of the present invention will be described in detail with reference to the attached drawings.

Figure 3:
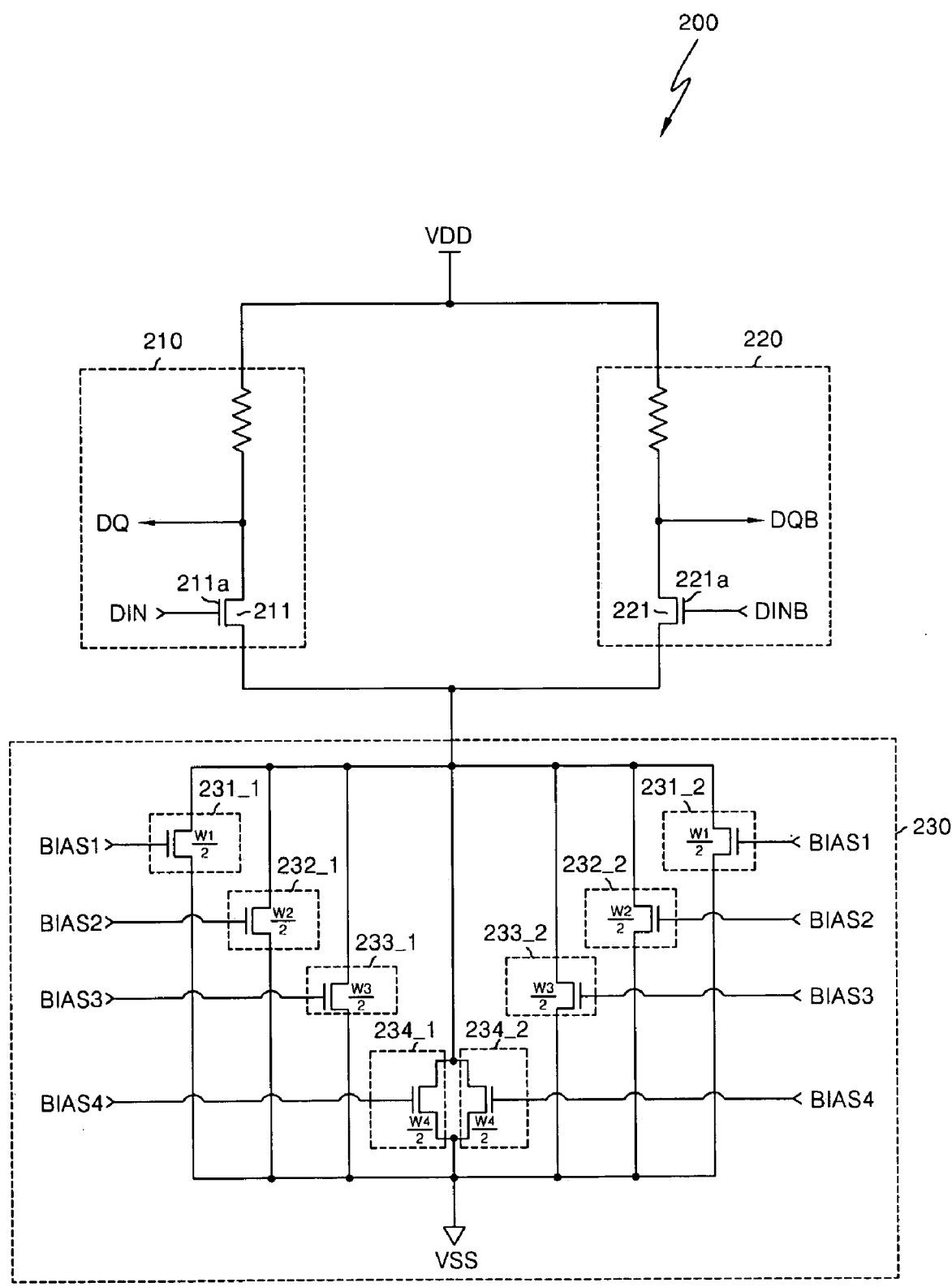
FIG. 3 is a circuit diagram of a signal driver according to an embodiment of the present invention.
Figure 4:
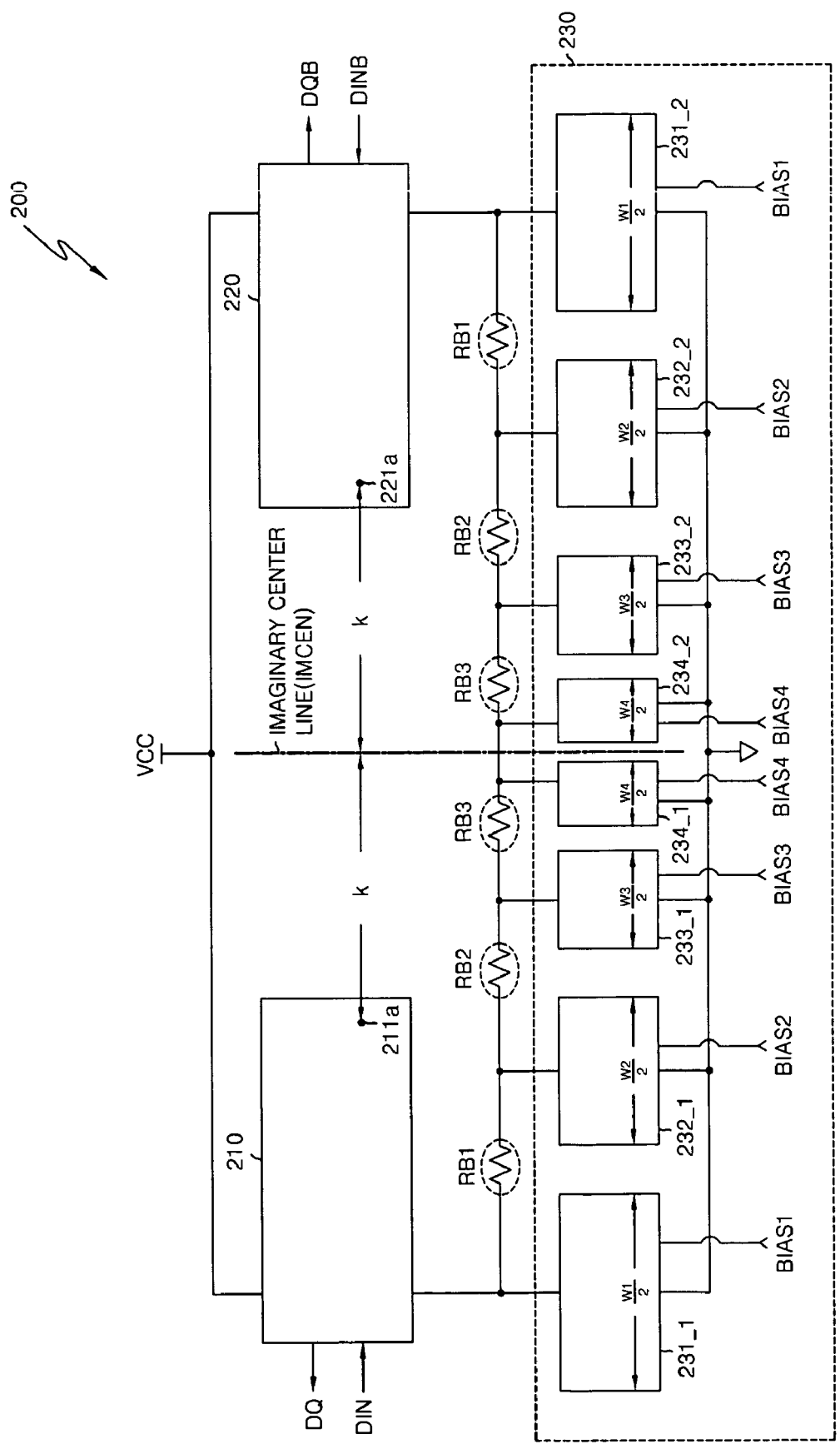
FIG. 4 is a view showing a layout structure of the signal driver of FIG. 3.

FIG. 3 is a circuit diagram of a signal driver 200 according to an embodiment of the present invention. The signal driver 200 is driven to amplify the voltage difference between a first input signal DIN and a second input signal DINB and generate first and second output signals DQ and DQB swinging in opposite directions. Referring to FIGS. 3 and 4, the signal driver 200 includes a first signal response unit 210, a second signal response unit 220 and a current source unit 230.

The first signal response unit 210 is driven in response to the first input signal DIN received through a first input gate terminal 211a, and generates the first output signal DQ. In this embodiment, the first input gate terminal 211a is the gate terminal of an NMOS transistor 211. The second signal response unit 220 is driven in response to the second input signal DINB received through a second input gate terminal 221a, and generates the second output signal DQB. In this embodiment, the second input gate terminal 221a is the gate terminal of an NMOS transistor 221. Preferably, the first and second signal response units 210 and 220 are symmetrically arranged.

The current source unit 230 includes a plurality of bias unit pairs 231_1/231_2 to 234_1/234_2. The bias unit pairs 231_1/231_2 to 234_1/234_2 restrict currents provided to the first and second signal response units 210 and 220 to respective source currents thereof in response to bias control signals BIAS1 to BIAS4 corresponding to the bias unit pairs 231_1/231_2 to 234_1/234_2, respectively. For reference in the present specification, each source current is defined as the maximum amount of current capable of flowing through each of the bias unit pairs 231_1/231_2 to 234_1/234_2. Furthermore, an embodiment in which the number of bias unit pairs 231_1/231_2 to 234_1/234_2 is four is shown and described, but it is apparent to those skilled in the art that the number of bias unit pairs can be extended or reduced.

Each of the bias unit pairs 231_1/231_2 to 234_1/234_2 includes at least two bias units each having the same amount of source current. Further, the two bias units, constituting a single bias unit pair, are implemented with MOS transistors that are gated in response to the same bias control signal, that is, one of the bias control signals BIAS1 to BIAS4. For example, two bias units 231_1 and 231_2, that constitute the first bias unit pair 231_1/231_2 and are gated in response to the first bias control signal BIAS1, have the same amount of source current.

According to a preferred embodiment, the two bias units 231_1 and 231_2 are implemented with MOS transistors having the same channel length and channel width. Further, the channel lengths of the transistors constituting the bias unit pairs 231_1/231_2 to 234_1/234_2 are preferably the same, and the channel widths thereof are differently set to W1 to W4, respectively, as shown in FIGS. 3 to 4. Further, in this embodiment, it is assumed that the condition W1>W2>W3>W4 is satisfied.

FIG. 4 is a view showing a layout structure of the components of the signal driver 200 of FIG. 3. With reference to FIG. 4, the arrangement of the components of the signal driver 200 of the present invention is described in detail.

As shown in FIG. 4, bias units forming pairs 231_1/231_2 to 234_1/234_2 are separately arranged on opposite sides of an imaginary centerline IMCEN so as to reduce current mismatch occurring between the first and second signal response units 210 and 220. The imaginary centerline IMCEN denotes an imaginary line that is a set of points spaced apart by the same distances from opposite reference points of the corresponding first and second signal response units 210 and 220. According to a preferred embodiment, the imaginary centerline is an imaginary line that is a set of points spaced apart by the same distances from the first and second input gate terminals 211a and 221a.

Preferably, the bias units forming each pair 231_1/231_2 to 234_1/234_2 are separated and symmetrically arranged on opposite sides of the imaginary centerline IMCEN. In this case, current mismatch occurring between the first and second signal response units 210 and 220 is further removed. Reference characters RB1 RB2 and RB3 of FIG. 4 are obtained by modeling resistors unintentionally generated between two neighboring bias units of the bias units 131_1/131_2 to 134_1/134_2.

Figure 2:
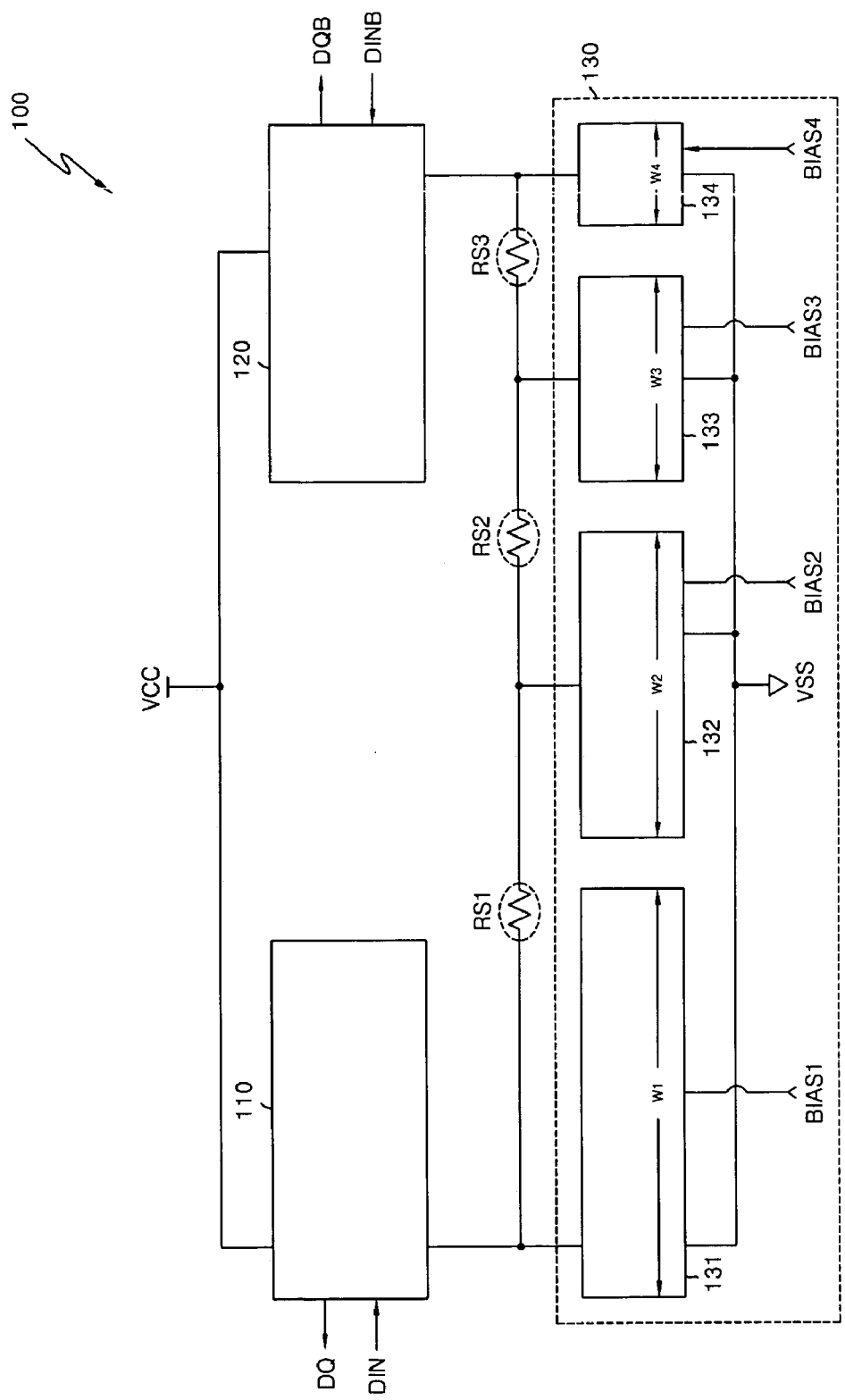
FIG. 2 is a view showing a layout structure of the signal driver of FIG. 1.
Figure 5:
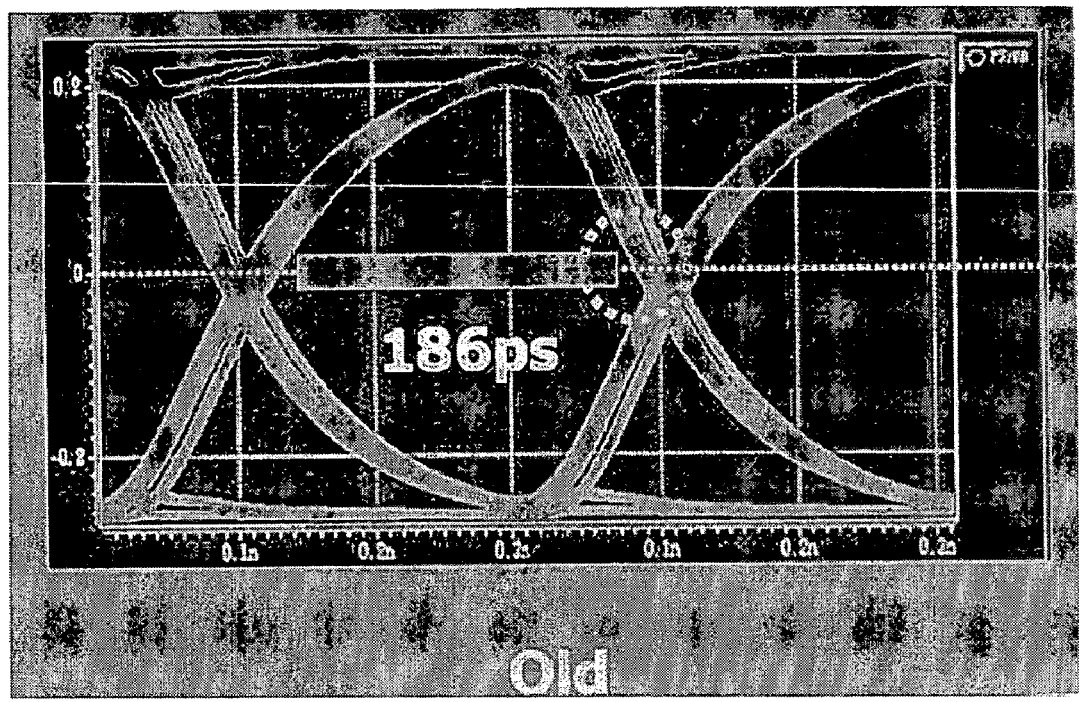
FIG. 5 is a view showing the effect of the signal driver according to the present invention.
Figure 5:
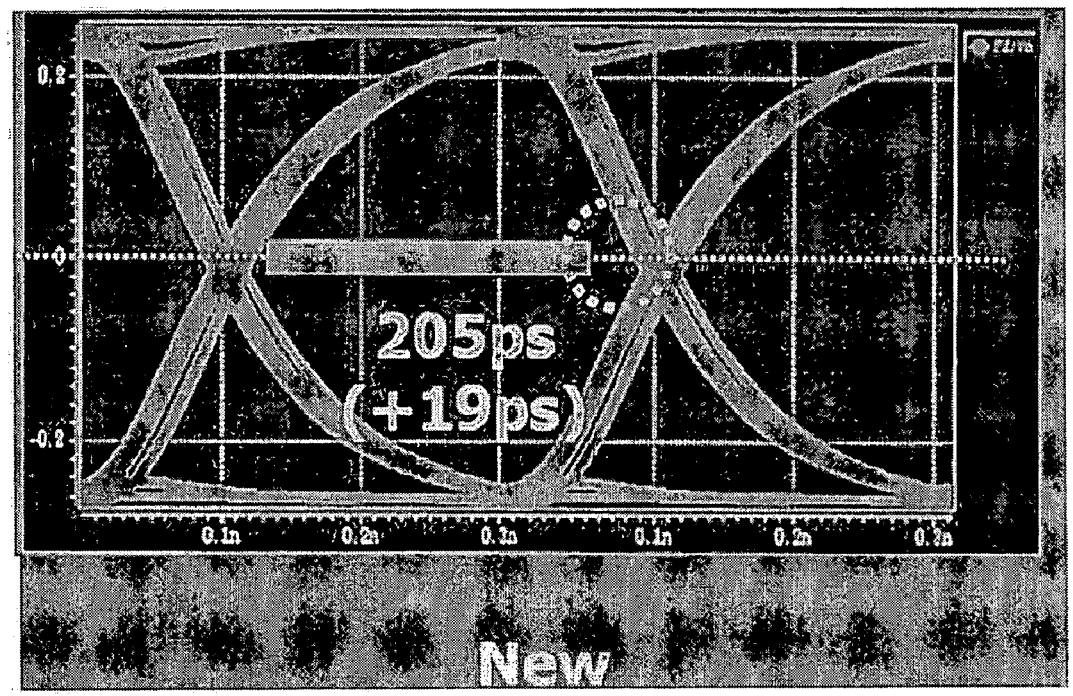

FIG. 5 is a view showing the effect of the signal driver according to the present invention, in which I shows the simulation results of waveforms of output signals in the layout structure of the conventional signal driver of FIG. 2, and II shows the simulation results of waveforms of output signals in the layout structure of the signal driver of the present invention. In this case, a supply voltage VDD, a ground voltage VSS, and voltage conditions of input signals DIN and DINB are equally given with respect to the two signal drivers.

Referring to FIG. 5, the interval of an output signal in the conventional signal driver is 186ps, and the interval of an output signal in the signal driver of the present invention is 205ps. Therefore, it can be seen that the signal driver of the present invention has an output signal interval greater than that of the conventional signal driver by about 19ps.

Figure 6:
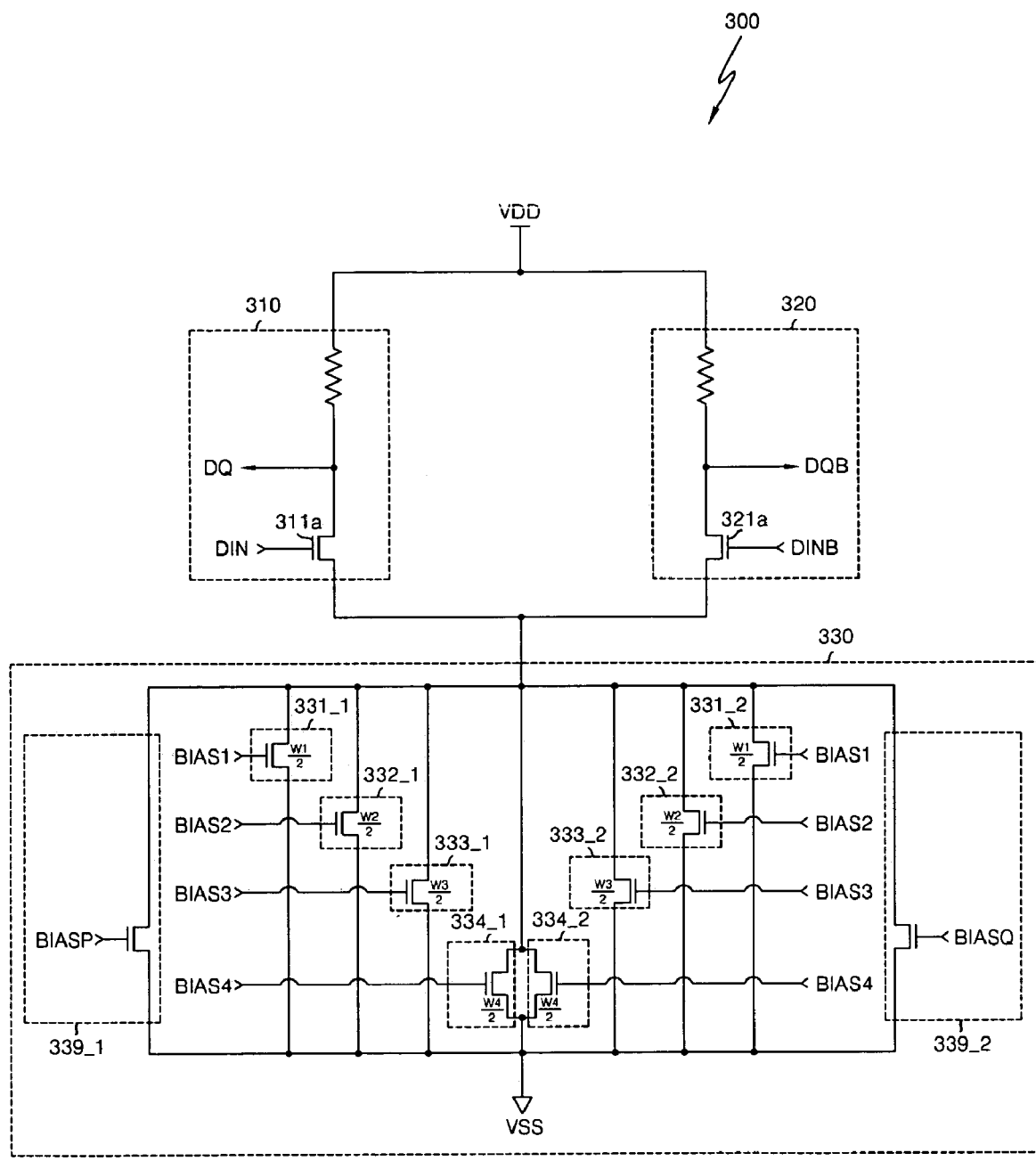
FIG. 6 is a circuit diagram of another signal driver according to another embodiment of the present invention.
Figure 7:
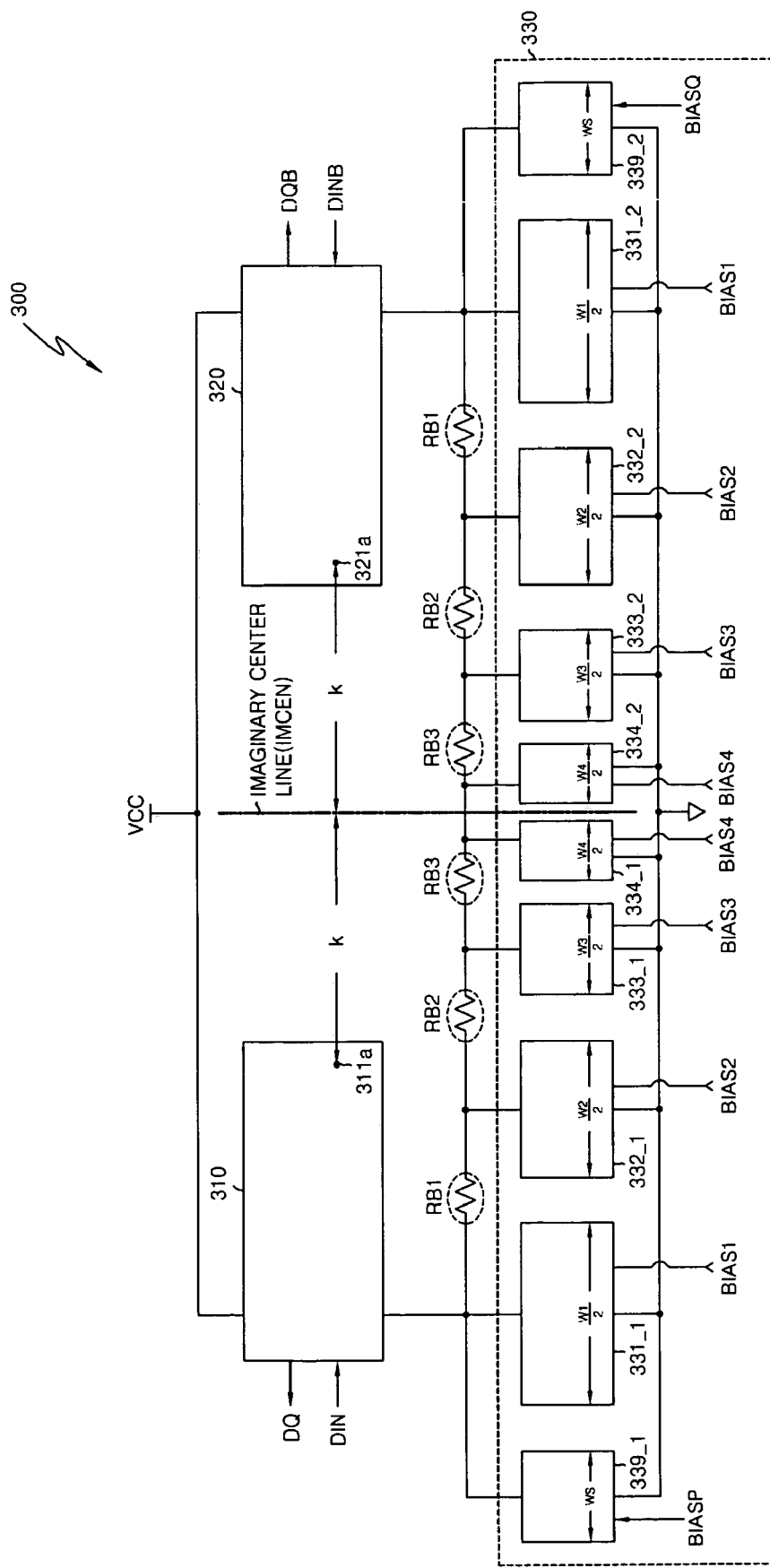
FIG. 7 is a view showing a layout structure of the signal driver of FIG. 6.

FIGS. 6 and 7 illustrate a circuit diagram and a layout structure of components of another signal driver 300 according to another embodiment of the present invention. The signal driver 300 of FIGS. 6 and 7 is a modified embodiment of the signal driver 200 of FIGS. 3 and 4. Referring to FIGS. 6 and 7, the signal driver 300 includes a current source unit 330 provided with first and second current matching units 339_1 and 339_2. Using the first and second current matching units 339_1 and 339_2, current mismatch occurring between first and second signal response units 310 and 320 can be more precisely corrected.

In detail, if the amount of current flowing through the first signal response unit 310 is less than that flowing through the second signal response unit 320, the first current matching units 339_1 is gated in response to a first compensation control signal BIASP. Further, if the amount of current flowing through the second signal response unit 320 is less than that flowing through the first signal response unit 310, the second current matching unit 339_2 is gated in response to a second compensation control signal BIASQ.

The construction and operation of other components of the signal driver 300 of FIGS. 6 and 7 are the same as the signal driver 200 of FIGS. 3 and 4, so that detailed descriptions thereof are omitted.

Although the preferred embodiments of the present invention have been disclosed for illustrative purposes, those skilled in the art will appreciate that various modifications, additions and substitutions are possible.

Embodiments in which each bias unit pair is separated into two bias units and the two bias units are arranged on opposite sides are shown and described. It is apparent to those skilled in the art that the technical spirit of the present invention can be implemented by other embodiments in which each bias unit pair is separated into four or six units and arranged thereby.

Embodiments in which bias units having a small amount of source current are arranged close to an imaginary centerline and bias units having a large amount of source current are arranged far from the imaginary centerline are shown. Those skilled in the art will appreciate that the technical spirit of the present invention can also be implemented by embodiments.

As described above for at least one embodiment of the present invention, a layout structure of a signal driver includes two bias units forming a single pair that are separately arranged on opposites sides of an imaginary centerline in a current source unit. According to the layout structure of the signal driver of the present invention, current mismatch occurring between first and second signal response units is reduced, thus consequently improving the operating characteristics of the signal driver.

What is claimed is:

1. A layout structure of a semiconductor device forming a signal driver, driven to correspond to a voltage difference between a first and a second input signal, wherein the signal driver comprises:
   a first signal response unit responding to the first input signal received through a first input gate terminal;
   a second signal response unit responding to the second input signal received through a second input gate terminal; and
   a current source unit, for restricting currents provided to the first and second signal response units to respective source currents thereof, having a plurality of bias unit pairs, each bias unit pair having at least two bias units, wherein the layout structure of the semiconductor device forming the signal driver comprises:
   the two bias units being separately arranged on opposite sides of a predetermined imaginary centerline so as to reduce current mismatch occurring between the first and second signal response units; and
   the imaginary centerline being an imaginary line that is a set of points spaced apart by the same distances from opposite reference points of the corresponding first and second signal response units.

2. The layout structure of the semiconductor device forming the signal driver according to claim 1, wherein each of the bias units includes a MOS transistor gated in response to a bias control signal corresponding to the bias units, thus controlling the amount of source current.

3. The layout structure of the semiconductor device forming the signal driver according to claim 1, wherein the current source unit further includes a first and a second current matching unit arranged on opposite sides of the imaginary centerline to compensate for current mismatch occurring between the first and second signal response units, the first and second current matching units being driven in response to a first and a second compensation control signal, respectively.

4. A layout structure of a semiconductor device signal driver, driven to correspond to a voltage difference between a first and a second input signal, wherein the signal driver comprises:
   a first signal response unit responding to the first input signal received through a first input gate terminal;
   a second signal response unit responding to the second input signal received through a second input gate terminal; and
   a current source unit, for restricting currents provided to the first and second signal response units to respective source currents thereof having a plurality of bias unit pairs, each bias unit pair having at least two bias units, wherein the layout structure of the semiconductor device forming the signal driver comprises:
   the two bias units being separately arranged on opposite sides of a predetermined imaginary centerline so as to reduce current mismatch occurring between the first and second signal response units; and
   the imaginary centerline being an imaginary line that is a set of points spaced apart by the same distances from the first and second input gate terminals.

5. The layout structure of the semiconductor device forming the signal driver according to claim 4, wherein each of the bias units includes a MOS transistor gated in response to a bias control signal corresponding to the bias units, thus controlling the amount of source current.

6. The layout structure of the semiconductor device forming the signal driver according to claim 4, wherein the current source unit further includes a first and a second current matching unit arranged on opposite sides of the imaginary centerline to compensate for current mismatch occurring between the first and second signal response units, the first and second current matching units being driven in response to a first and a second compensation control signal, respectively.

7. A layout structure of a semiconductor device forming a signal driver, driven to correspond to a voltage difference between a first and a second input signal, wherein the signal driver comprises:
   a first signal response unit responding to the first input signal received through a first input gate terminal;
   a second signal response unit responding to the second input signal received through a second input gate terminal; and
   a current source unit, for restricting currents provided to the first and second signal response units to respective source currents thereof, having a plurality of bias unit pairs and a first and a second current matching unit, wherein the layout structure of the semiconductor device forming the signal driver comprises:
   the first and second current matching unit being separately arranged on opposite sides of a predetermined imaginary centerline so as to compensate for the current mismatch occurring between the first and second signal response units; and
   the imaginary centerline being an imaginary line that is a set of points spaced apart by the same distances from opposite reference points of the corresponding first and second signal response units.

* * * * *